United States Patent
Wang

(10) Patent No.: US 7,397,304 B2
(45) Date of Patent: Jul. 8, 2008

(54) AUTO GAIN CONTROL CIRCUIT

(75) Inventor: I-Hsin Wang, Taipei County (TW)

(73) Assignee: Princeton Technology Corporation, Hsin Tien, Taipei County (TW)

( * ) Notice: Subject to any disclaimer, the term of this patent is extended or adjusted under 35 U.S.C. 154(b) by 86 days.

(21) Appl. No.: 11/607,863

(22) Filed: Dec. 4, 2006

(65) Prior Publication Data

US 2008/0048775 A1    Feb. 28, 2008

(30) Foreign Application Priority Data

Aug. 22, 2006    (TW) ............................... 95214845 U

(51) Int. Cl.
*H03G 3/20*    (2006.01)
(52) U.S. Cl. ........................................ 330/136
(58) Field of Classification Search .................. 330/136, 330/279, 149
See application file for complete search history.

(56) References Cited

U.S. PATENT DOCUMENTS 6,073,848 A * 6/2000 Giebel .................... 235/462.26
7,109,792 B2 * 9/2006 Leffel .......................... 330/149

* cited by examiner

*Primary Examiner*—Robert Pascal
*Assistant Examiner*—Hieu P Nguyen
(74) *Attorney, Agent, or Firm*—Muncy, Geissler, Olds, & Lowe, PLLC

(57) ABSTRACT

An auto gain control circuit comprises a first peak detector, a variable gain amplifier, a second peak detector, a multiplexer and a controller. The first peak detector detects peaks of an input signal to generate a first peak signal. The variable gain amplifier amplifies the input signal to generate an output signal according to a control signal. The second peak detector detects peaks of the output signal to generate a second peak signal. The multiplexer selectively outputs the first peak signal or the second peak signal according to a first control signal. The controller generates the control signal according to the second peak signal and the first peak signal or according to the second peak signal and the reference voltage.

17 Claims, 4 Drawing Sheets

AUTO GAIN CONTROL CIRCUIT

BACKGROUND OF THE INVENTION

1. Field of the Invention

The invention relates to an auto gain control circuit. In particular, the invention relates to an auto gain control circuit with zero decibel gain.

2. Description of the Related Art

FIG. 1 illustrates a conventional auto gain control circuit 100 with zero decibel gain. Auto gain control circuit 100 comprises peak detector 110, variable gain amplifier 120, multiplexer 150, comparator 164 and integrator 162. Output terminal is controlled by control signal $S_0$ to output signals $S_{11}$ or $S_{12}$. In the application of zero decibel gain, multiplexer 150 directly outputs signal $S_{11}$. In the application of auto control gain, multiplexer 150 outputs signal $S_{12}$. Peak detector 110 detects peaks of signal $S_{12}$ to generate peak signal $S_{14}$. Comparator 164 compares peak signal $S_{14}$ with reference signal $V_{ref}$ to generate comparative signal $S_{15}$. When peak signal $S_{14}$ is higher than reference signal $V_{ref}$, comparator 164 outputs comparative signal $S_{15}$ to decrease charges of integrator 162 for decreasing the voltage level of control signal $S_{16}$. Similarly, when peak signal S14 is lower than reference signal $V_{ref}$, comparator 164 outputs comparative signal $S_{15}$ to increase charges of integrator 162 such that the voltage level of control signal $S_{16}$ increases. Thus, the output range of output signal $S_{12}$ is adjusted by variable gain amplifier which is controlled by control signal $S_{16}$. When this negative feedback loop locked, the output signal strength will be stable.

However, noise generated by multiplexer 150 is directly transmitted to output terminal during switching of multiplexer 150, interfering with output signals. If the instant variation of the output signals is too large, subsequent stage circuits will be saturated or abnormal. If conventional auto gain control circuit 100 is applied in audio speaker systems, during switching of multiplexer 150, users will be disturb by excess noise generated by outputting speakers.

BRIEF SUMMARY OF THE INVENTION

An auto gain control circuit comprises a first peak detector, a variable gain amplifier, a second peak detector, a multiplexer and a controller. The first peak detector receives an input signal and detects peaks of the input signal to generate a first peak signal. The variable gain amplifier receives the input signal and adjusts a gain of the variable gain amplifier to amplify the input signal to generate an output signal according to a control signal. The second peak detector is coupled to the variable gain amplifier to receive the output signal and detects peaks of the output signal to generate a second peak signal. The multiplexer is coupled to the first peak detector to receive the first peak signal, receives a reference voltage and selectively outputs the first peak signal or the reference voltage according to a first control signal. The controller is coupled to the variable gain amplifier, the second peak detector and the multiplexer and generates the control signal according to the second peak signal and one of the first peak signal and the reference voltage from the multiplexer.

An auto gain control circuit comprises a first peak detector, a variable gain amplifier, a second peak detector, a multiplexer, a comparator and an integrator. The first peak detector receives an input signal and detects peaks of the input signal to generate a first peak signal. The variable gain amplifier receives the input signal and adjusts a gain of the variable gain amplifier to amplify the input signal to generate an output signal according to a control signal. The variable gain amplifier comprises a resistor, a first transistor, a second transistor, a third transistor and a fourth transistor. The resistor is coupled to a first voltage source. The first transistor has a first terminal coupled to the resistor, a second terminal receiving the input signal and a third terminal. The second transistor has a fourth terminal coupled to the third terminal of the first transistor, a fifth terminal coupled to the third terminal of the first transistor and a sixth terminal. The third transistor has a seventh terminal coupled to the sixth terminal of the second transistor, an eighth terminal receiving the control signal and a ninth terminal coupled to a second voltage source. The fourth transistor has a tenth terminal coupled to the third terminal of the first transistor, an eleventh terminal receiving the control signal and a twelfth terminal coupled to the second voltage source. The second peak detector is coupled to the variable gain amplifier to receive the output signal and detects peaks of the output signal to generate a second peak signal. The multiplexer is coupled to the first peak detector to receive the first peak signal, receives a reference voltage and selectively outputs the first peak signal or the reference voltage according to a first control signal. The comparator is coupled to the second peak detector and the multiplexer and generates a comparative signal by comparing the second peak signal and one of the first peak signal and the reference voltage from the multiplexer. The integrator is coupled to the comparator and the variable gain amplifier to generate the control signal according to the comparative signal.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
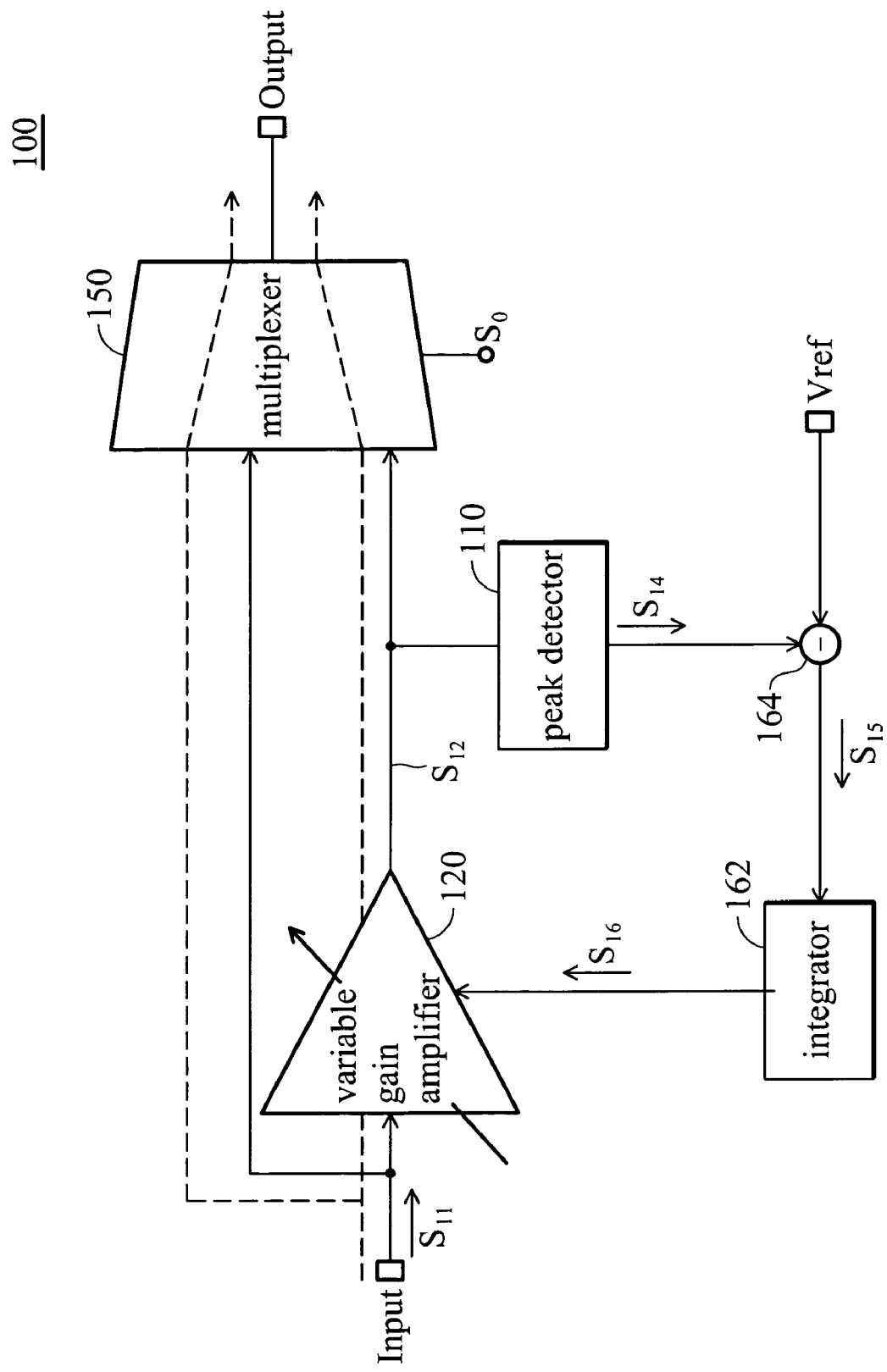
FIG. 1 illustrates a conventional auto gain control circuit with zero decibel gain.
Figure 2:
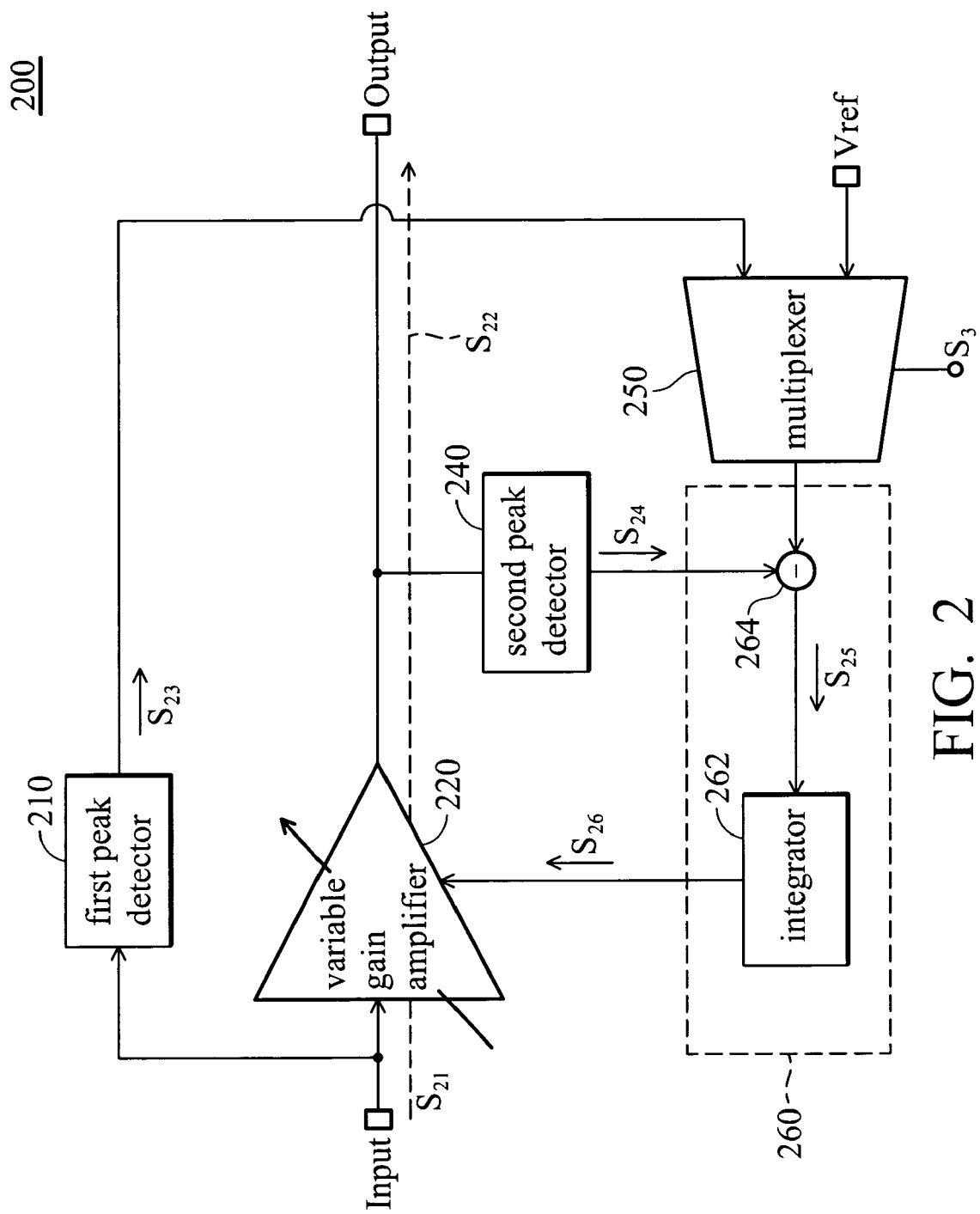
FIG. 2 shows an auto gain control circuit according to an embodiment of the invention.

FIG. 2 shows auto gain control circuit 200 according to an embodiment of the invention. Auto gain control circuit 200 comprises first peak detector 210, variable gain amplifier 220, second peak detector 240, multiplexer 250 and controller 260. First peak detector 210 receives input signal $S_{21}$ from input terminal Input and detects peaks of input signal $S_{21}$ to generate first peak signal $S_{23}$. Variable gain amplifier 220 receives input signal $S_{21}$ and adjusts its gain to amplify input signal $S_{21}$ to generate output signal $S_{22}$ to output terminal Output according to control signal $S_{26}$.

Figure 3:
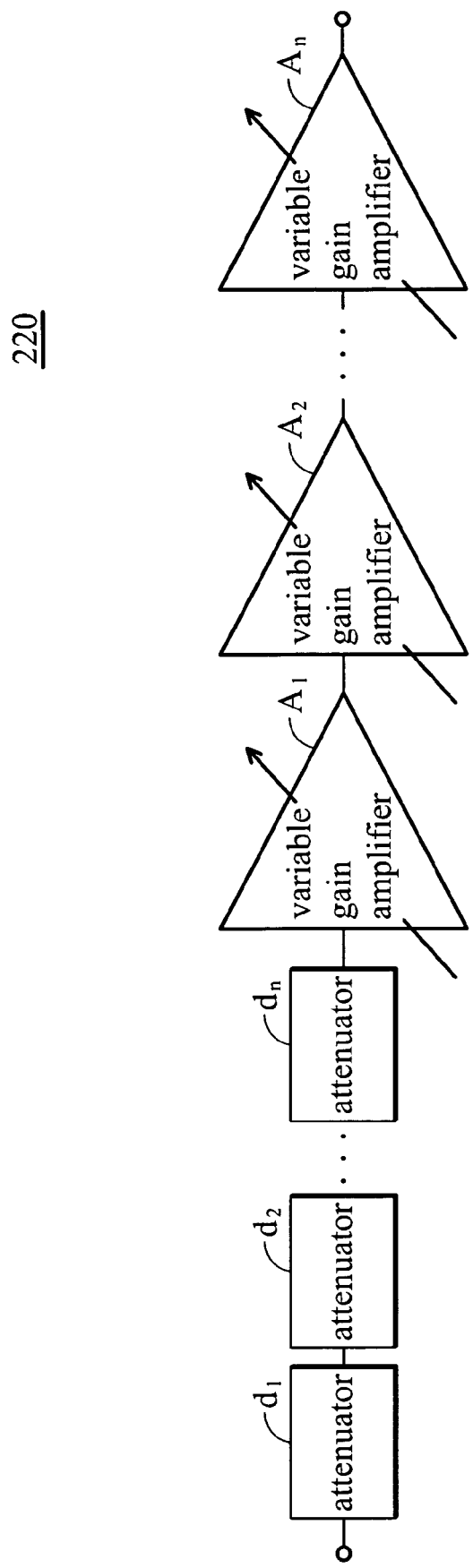
FIG. 3 shows a variable gain amplifier according to an embodiment of the invention.

In an embodiment of the invention, variable gain amplifier 220 may amplify or attenuate input signal $S_{21}$. For example, the range of the gain of variable gain amplifier 220 is −10 dB~+10 dB. In another embodiment of the invention, variable gain amplifier 220 further comprises a plurality of attenuators ($d_1, d_2 \ldots d_n$) and a plurality of variable gain amplifiers ($A_1, A_2 \ldots A_n$) coupled in serial, as shown in FIG. 3. Attenuators ($d_1, d_2 \ldots d_n$) may be voltage dividers. Second peak detector 240 is coupled to variable gain amplifier 220 to receive output signal $S_{22}$ and detects peaks of output signal $S_{22}$ to generate second peak signal $S_{24}$. Multiplexer 250 is coupled to first peak detector 210 to receive first peak signal $S_{23}$ and reference voltage $V_{ref}$. Multiplexer 250 selectively outputs first peak signal $S_{23}$ or reference voltage $V_{ref}$ according to control signal $S_3$. Controller 260 is coupled to variable gain amplifier 220, second peak detector 240 and multiplexer 250. Controller 260 generates control signal $S_{26}$ according to second peak signal $S_{24}$ and one of first peak signal $S_{23}$ and reference voltage $V_{ref}$ from multiplexer 250. Controller 260 further comprises comparator 264 and integrator 262. Comparator 264 compares second peak signal $S_{24}$ and one of first peak signal $S_{23}$ and reference voltage $V_{ref}$ from multiplexer 250 to generate comparative signal $S_{25}$. Integrator 262 is coupled to comparator 264 and generates control signal $S_{26}$ according to comparative signal $S_{25}$.

According to an embodiment of the invention, integrator 262 comprises at least one capacitor. Integrator 262 accumulates charges of comparative signal $S_{25}$ to generate corresponding control signal $S_{26}$. For example, if multiplexer 250 selects to output first peak signal $S_{23}$, after a period, auto gain control circuit 200 will stay locked. The gain of variable gain amplifier 220 will stabilize at 0 dB. Input signal $S_{21}$ is thus equal to output signal $S_{22}$. If multiplexer 250 selects to output reference voltage $V_{ref}$, auto gain control circuit 200 generates comparative signal $S_{25}$ by using comparator 264 to compare second peak signal $S_{24}$ and reference voltage $V_{ref}$. When second peak signal $S_{24}$ exceeds reference voltage $V_{ref}$, comparator 264 outputs comparative signal $S_{25}$ to decrease charges of integrator 262 for decreasing a voltage level of control signal $S_{26}$. Similarly, when second peak signal $S_{24}$ is lower than reference voltage $V_{ref}$, comparator 264 outputs comparative signal $S_{25}$ to increase charges of integrator 262 for increasing the voltage level of control signal $S_{26}$. Auto gain control circuit 200 uses control signal $S_{26}$ to control variable gain amplifier 220 to adjust output range of output signal $S_{22}$. Since integrator 262 comprises capacitors, output signal $S_{22}$ will be gradually adjusted. Output signal $S_{22}$ will not change sharply, avoiding saturation or abnormality of subsequent stage circuits. In addition, input signal $S_{21}$ may be an audio signal with frequency range 400~30 KHz.

Figure 4:
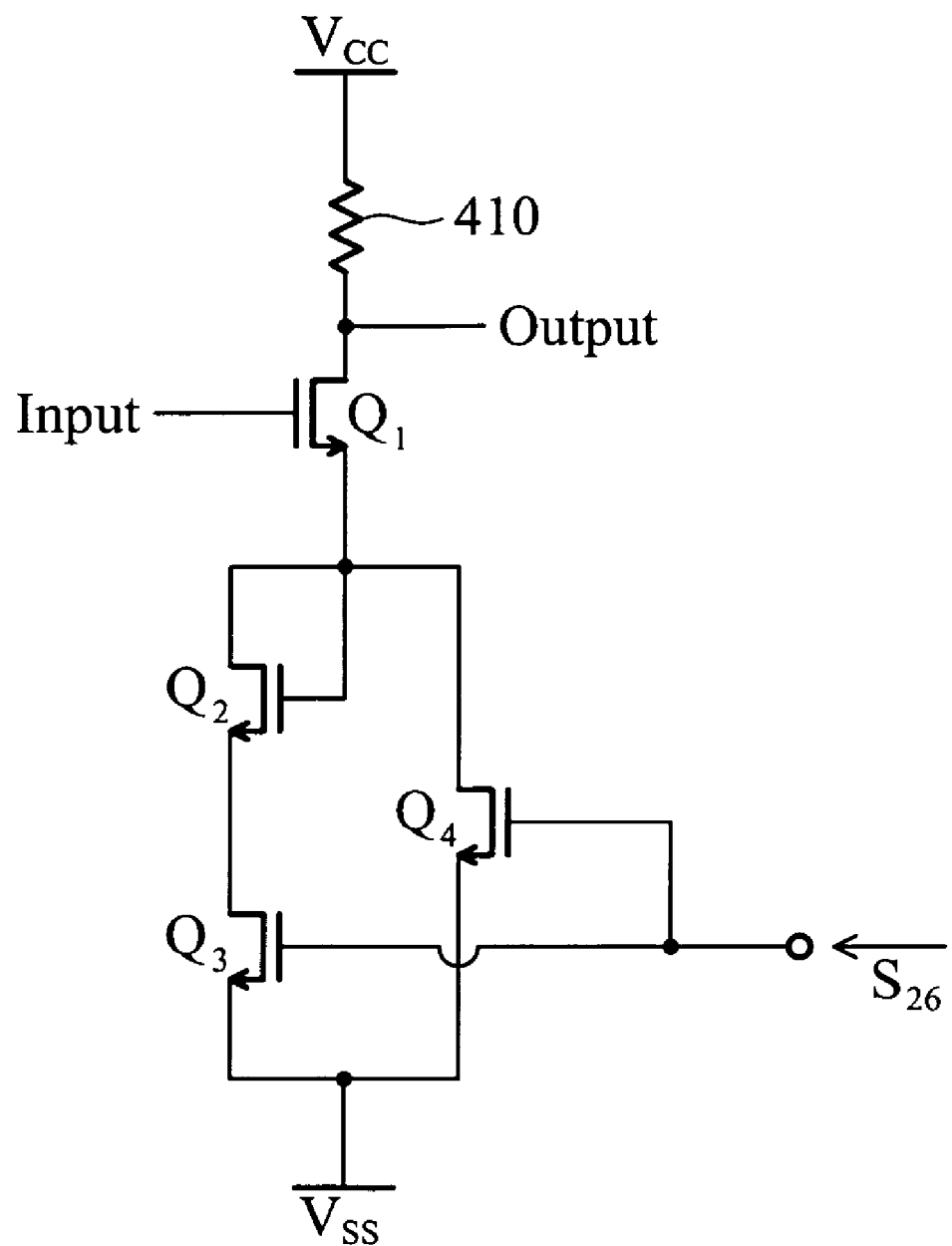
FIG. 4 shows a variable gain amplifier according to an embodiment of the invention.

FIG. 4 shows variable gain amplifier 400 according to an embodiment of the invention. Variable gain amplifier 400 comprises resistor 410, first transistor Q1, second transistor Q2, third transistor Q3 and fourth transistor Q4. Resistor 410 is coupled between first voltage source Vcc and output terminal Output. First transistor Q1 comprises a drain coupled to resistor 410, a gate coupled to input terminal Input and a source. Second transistor Q2 comprises a drain coupled to the source of first transistor Q1, a gate coupled to the source of first transistor Q1 and a source. Third transistor Q3 comprises a drain coupled to the source of second transistor Q2, a gate receiving control signal $S_{26}$ and a source coupled to second voltage source Vss. Fourth transistor Q4 comprises a drain coupled to the source of first transistor Q1, a gate receiving control signal $S_{26}$ and a source coupled to second voltage source Vss. In addition, first transistor Q1, second transistor Q2, third transistor Q3 and fourth transistor Q4 are all NMOS (Negative-Channel Metal Oxide Semiconductor) transistors.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An auto gain control circuit, comprising:
    a first peak detector receiving an input signal and detecting peaks of the input signal to generate a first peak signal;
    a variable gain amplifier receiving the input signal and adjusting a gain of the variable gain amplifier to amplify the input signal to generate an output signal according to a control signal;
    a second peak detector coupled to the variable gain amplifier to receive the output signal and detecting peaks of the output signal to generate a second peak signal;
    a multiplexer coupled to the first peak detector to receive the first peak signal, receiving a reference voltage and selectively outputting the first peak signal or the reference voltage according to a first control signal; and
    a controller coupled to the variable gain amplifier, the second peak detector and the multiplexer and generating the control signal according to the second peak signal and one of the first peak signal and the reference voltage from the multiplexer.

2. The auto gain control circuit as claimed in claim 1, wherein the controller further comprises:
    a comparator coupled to the second peak detector and the multiplexer and generating a comparative signal by comparing the second peak signal and one of the first peak signal and the reference voltage from the multiplexer; and
    an integrator coupled to the comparator and the variable gain amplifier to generate the control signal according to the comparative signal.

3. The auto gain control circuit as claimed in claim 1, wherein the gain of the variable gain amplifier is between −10 dB and +10 dB.

4. The auto gain control circuit as claimed in claim 1, wherein the variable gain amplifier further comprises an attenuator and a first variable gain amplifier.

5. The auto gain control circuit as claimed in claim 4, wherein the attenuator is coupled to the first variable gain amplifier in serial.

6. The auto gain control circuit as claimed in claim 4, wherein the attenuator is a voltage divider.

7. The auto gain control circuit as claimed in claim 1, wherein the variable gain amplifier comprises a plurality of second variable gain amplifiers.

8. The auto gain control circuit as claimed in claim 1, wherein the input signal is an audio signal.

9. The auto gain control circuit as claimed in claim 1, wherein a frequency range of the input signal is 400~30 KHz.

10. The auto gain control circuit as claimed in claim 1, the variable gain amplifier comprising:
    a resistor coupled to a first voltage source;
    a first transistor having a first terminal coupled to the resistor, a second terminal receiving the input signal and a third terminal;
    a second transistor having a fourth terminal coupled to the third terminal of the first transistor, a fifth terminal coupled to the third terminal of the first transistor and a sixth terminal;
    a third transistor having a seventh terminal coupled to the sixth terminal of the second transistor, an eighth terminal receiving the control signal and a ninth terminal coupled a second voltage source; and
    a fourth transistor having a tenth terminal coupled to the third terminal of the first transistor, an eleventh terminal receiving the control signal and a twelfth terminal coupled to the second voltage source.

11. The auto gain control circuit as claimed in claim 1, wherein the first transistor, the second transistor, the third transistor and the fourth transistor are NMOS transistors.

12. An auto gain control circuit, comprising:
a first peak detector receiving an input signal and detecting peaks of the input signal to generate a first peak signal;
a variable gain amplifier receiving the input signal and adjusting a gain of the variable gain amplifier to amplify the input signal to generate an output signal according to a control signal, comprising:
  a resistor coupled to a first voltage source;
  a first transistor having a first terminal coupled to the resistor, a second terminal receiving the input signal and a third terminal;
  a second transistor having a fourth terminal coupled to the third terminal of the first transistor, a fifth terminal coupled to the third terminal of the first transistor and a sixth terminal;
  a third transistor having a seventh terminal coupled to the sixth terminal of the second transistor, an eighth terminal receiving the control signal and a ninth terminal coupled to a second voltage source; and
  a fourth transistor having a tenth terminal coupled to the third terminal of the first transistor, an eleventh terminal receiving the control signal and a twelfth terminal coupled to the second voltage source;
a second peak detector coupled to the variable gain amplifier to receive the output signal and detecting peaks of the output signal to generate a second peak signal;
a multiplexer coupled to the first peak detector to receive the first peak signal, receiving a reference voltage and selectively outputting the first peak signal or the reference voltage according to a first control signal;
a comparator coupled to the second peak detector and the multiplexer and generating a comparative signal by comparing the second peak signal and one of the first peak signal and the reference voltage from the multiplexer; and
an integrator coupled to the comparator and the variable gain amplifier to generate the control signal according to the comparative signal.

13. The auto gain control circuit as claimed in claim 12, wherein the integrator comprises at least one capacitor.

14. The auto gain control circuit as claimed in claim 12, wherein the input signal is an audio signal.

15. The auto gain control circuit as claimed in claim 12, wherein a frequency range of the input signal is 400~30 KHz.

16. The auto gain control circuit as claimed in claim 12, wherein the variable gain amplifier comprises a plurality of second variable gain amplifiers.

17. The auto gain control circuit as claimed in claim 12, the first transistor, the second transistor, the third transistor and the fourth transistor are NMOS transistors.

* * * * *